United States Patent
Loo et al.

(10) Patent No.: US 11,111,134 B2
(45) Date of Patent: Sep. 7, 2021

(54) METHOD FOR PROCESSING CONDUCTIVE STRUCTURE

(71) Applicant: AAC Acoustic Technologies (Shenzhen) Co., Ltd., Shenzhen (CN)

(72) Inventors: Lieng Loo, Shenzhen (CN); Shaoquan Wang, Shenzhen (CN); Xiaohui Zhong, Shenzhen (CN); Kahkeen Lai, Shenzhen (CN); Kianheng Goh, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 16/240,869

(22) Filed: Jan. 7, 2019

(65) Prior Publication Data
US 2019/0337799 A1 Nov. 7, 2019

(30) Foreign Application Priority Data

May 7, 2018 (CN) .......................... 201810427943.0

(51) Int. Cl.
| H01L 21/768 | (2006.01) |
| B81C 1/00 | (2006.01) |
| B81B 7/02 | (2006.01) |

(52) U.S. Cl.
CPC .......... B81C 1/00095 (2013.01); B81B 7/02 (2013.01); B81C 1/00055 (2013.01); B81C 1/00531 (2013.01); B81B 2201/02 (2013.01); B81C 2201/0132 (2013.01)

(58) Field of Classification Search
CPC .................................................. H01L 21/76898
See application file for complete search history.

(56) References Cited

U.S. PATENT DOCUMENTS

| 2010/0264548 | A1* | 10/2010 | Sanders | ............ H01L 21/76898 |
| | | | | 257/774 |
| 2012/0280395 | A1* | 11/2012 | Farooq | .............. H01L 21/76898 |
| | | | | 257/754 |
| 2018/0019187 | A1* | 1/2018 | Lagouge | ............... H01L 23/481 |
| 2019/0275561 | A1* | 9/2019 | Fife | ....................... B06B 1/0207 |

* cited by examiner

Primary Examiner — Christopher A Johnson
(74) Attorney, Agent, or Firm — IPro, PLLC; Na Xu

(57) ABSTRACT

The present disclosure provides a method for processing a conductive structure. The method includes the following steps of: forming on a first surface a groove concave from the first surface towards a second surface by means of dry etching; extending the groove from the second surface to form a via through a silicon base; and processing a conductive structure within the via. The method can be applied to a silicon base having a thickness larger than 300 μm. It breaks the limit on thickness that can be processed in the related art and is capable of providing electrical connectivity on both sides of a silicon base. The method is simple and highly reliable, has high processing efficiency and is applicable to mechanized production.

7 Claims, 2 Drawing Sheets

METHOD FOR PROCESSING CONDUCTIVE STRUCTURE

CROSS-REFERENCE TO RELATED APPLICATIONS

The present application claims priority to Chinese Patent Application No. 201810427943.0, filed on May 7, 2018, the content of which is incorporated herein by reference in its entirety.

TECHNICAL FIELD

The present disclosure relates to the field of sensors and in particular, to a method for processing a conductive structure.

BACKGROUND

Sensors based on Micro-Electro-Mechanical System (MEMS) are widely applied in societies, industries and daily lives, including ultrasonic processing, ultrasonic positioning, ultrasonic probing, ultrasonic imaging and the like.

In order to provide electrical connectivity, when a MEMS sensor is manufactured, conductive terminals made of aluminum are provided at both sides of a silicon base. Further, a conductive via needs to be processed in the silicon base and a conductive material needs to be filled in the conductive via to provide electrical connectivity. The existing methods for processing the via mainly include mechanical drilling or wet chemical etching. However, the mechanical drilling is not convenient for industrial production and the wet chemical etching is only applicable to thin silicon bases having thicknesses smaller than 100 μm.

There is thus a need for a novel method for processing a conductive structure to solve the above problem.

DESCRIPTION OF EMBODIMENTS

In the following, the present disclosure will be further explained with reference to the figures and embodiments.

As shown in FIG. 1 and FIGS. 2a-2j, a method for processing a conductive structure according to an embodiment can be applied to a silicon base having a thickness larger than 300 μm. It can effectively break the limit on thicknesses of silicon bases in the related art. The method is simple, has low cost and is applicable to mechanized production.

In particular, the method includes the following steps.

At step S1, as shown in FIGS. 2a-2e, a silicon base 1 is provided. The silicon base 1 includes a first surface 11 and a second surface 12 opposite to the first surface 11. The first surface 11 and the second surface 12 have a thickness larger than 300 μm therebetween. A groove 101 concave from the first surface 11 towards the second surface 12 is formed on the first surface 11 by means of dry etching.

Figure 1:
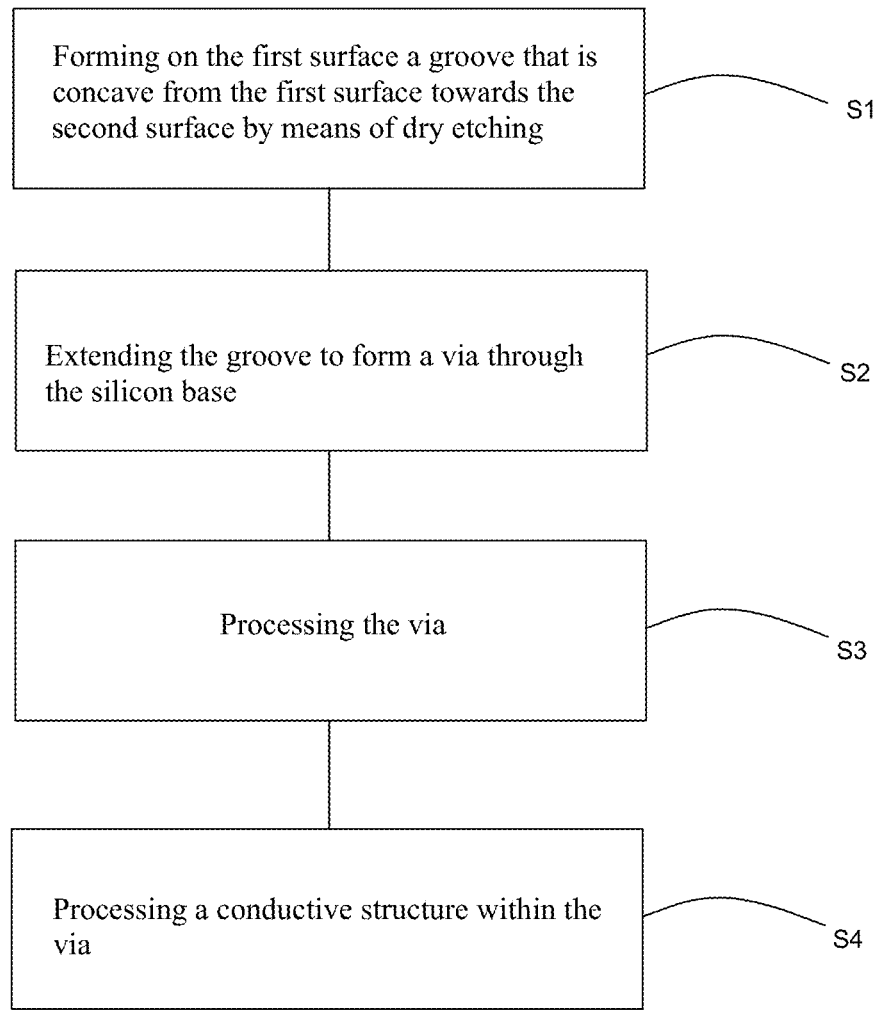
FIG. 1 is a flowchart illustrating a method for processing a conductive structure according to the present disclosure.
Figure 2A:
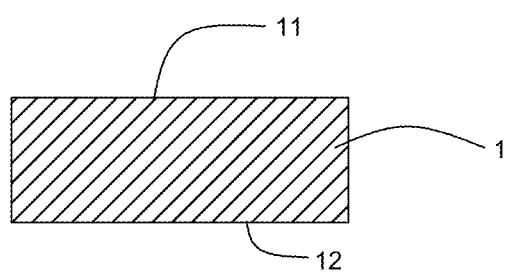
FIGS. 2a-2j are schematic diagrams showing a processing procedure of a method for processing a conductive structure according to the present disclosure.
Figure 2F:
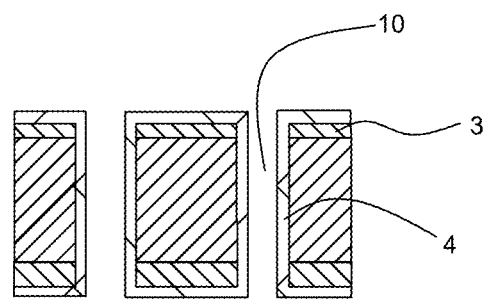

At step S2, as shown in FIG. 2f, the groove 101 is extended from the second surface 12 to form a via 10 through the silicon base.

Figure 2B:
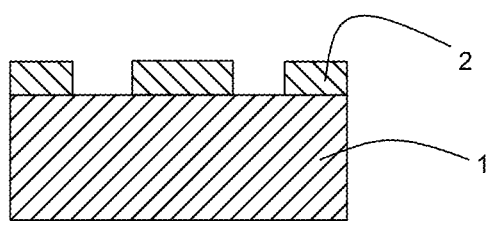
Figure 2G:
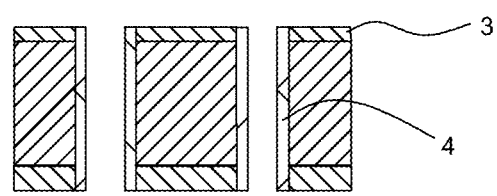
Figure 2C:
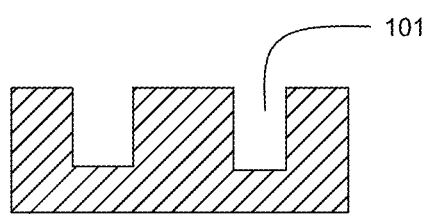
Figure 2H:
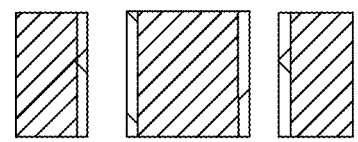
Figure 2D:
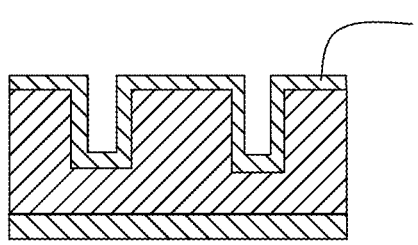
Figure 2I:
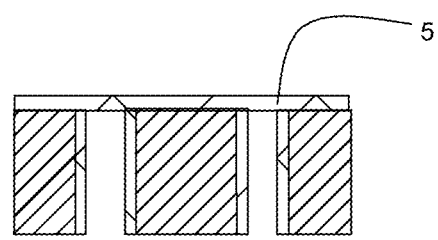

At step S3, as shown in FIGS. 2g-2h, the via 10 formed in the step S2 is processed for further processing.

At step S4, a conductive structure is processed within the via.

In particular, the step S1 may include the following steps.

At step S11, as shown in FIG. 2b, a pattern is formed on the first surface 11 of the silicon base 1, so as to provide a protection layer 2 on a portion where the via is not provided. The protection layer 2 is used to protect the silicon material it covers from being damaged while the silicon base 1 is etched subsequently.

At step S12, the groove concave from the first surface towards the second surface is formed on a portion where the protection layer 2 is not provided by means of dry etching. Due to the large distance between the first surface 11 and the second surface 12, the bottom of the groove 101 formed by means of etching is in the middle of the silicon base 1 and the distance between the bottom of the groove 101 and the first surface 11 is larger than a half of the thickness of the silicon base 1.

At step S13, an oxide layer 3 is formed by means of oxidation from two directions, i.e., from the first surface 11 and the second surface 12. The oxide layer 3 extends into the groove 101 with the first surface 11 to form a blocking layer 31 at the bottom of the groove 101.

Figure 2E:
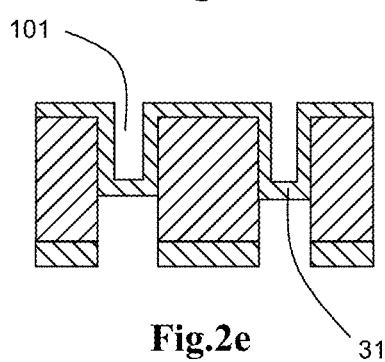
Figure 2J:
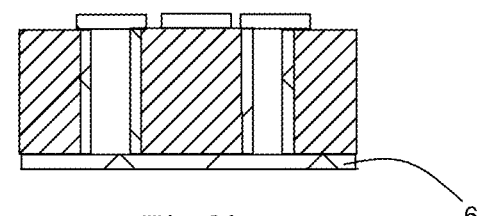

At shown in FIG. 2e, in the step S2, the second surface 12 is etched in an opposite direction until the blocking layer 31, forming a second groove 102 corresponding to the groove 101. The blocking layer 31 is provided between the groove 101 and the second groove 102. Then, the blocking layer 31 is removed such that the groove 101 and the second groove 102 connect to form the via. In particular, the blocking layer 31 can be removed by means of wet etching or mechanical cutting.

In the step S3, the via 10 can be cleaned by means of wet etching, so as to remove the residual oxide layer. It is to be noted that the steps S2 and S3 can be combined into one step. That is, the blocking layer 31 and the oxide layer on the inner wall of the via 10 can be removed at a time by means of wet etching.

Referring to FIGS. 2f-2j, the step S4 includes the following steps.

At step S41, doped polysilicon is deposited within the via. With the conductivity of the doped polysilicon, an electrical connectivity can be provided between the first surface 11 and the second surface 12. In particular, it includes the following steps. At step S411, doped polysilicon is deposited on the silicon base having the via provided therein. A doped polysilicon layer 4 so formed covers the entire first surface 11, the second surface 12 and the inner wall of the via 10. Then, at a step S412, the doped polysilicon deposited on the first surface 11 and the second surface 12 is removed by using a CMP mixed indicator, to form a doped polysilicon layer 4 that only covers the inner wall of the via 10.

At step S42, the oxide layer 3 on the first surface 11 and the second layer 12 is removed by means of wet etching, and a first aluminum conductive layer 5 and a second aluminum conductive layer 6 are provided on the first surface 11 and the second surface 12.

At step S43, a pattern on the first aluminum conductive layer and/or the second aluminum conductive layer is formed to form the conductive structure. In particular, it includes the following steps. At step S431, a pattern is formed on the first aluminum conductive layer 5 and/or the second aluminum conductive layer 6 and a protection layer is provided on a portion where the via is not provided. At step S432, the conductive structure is formed by wet etching the first aluminum conductive layer 5 and/or the second aluminum conductive layer 6. In particular, the conductive structure may be a conductive lead and a conductive terminal, which can provide the electrical connectivity together with the doped polysilicon layer 4 formed in the step S41.

It is to be noted that the steps S42 and S43 are not necessarily performed in any specific order. The first surface 11 can be processed first and then the second surface 12 can be processed, or they can be processed simultaneously. The conductive structure can be processed on one surface only and the aluminum conductive layer can be provided on the other surface only. In another example, the conductive structure can be processed on both surfaces as desired.

Compared with the related art, the present disclosure provides a method for processing a conductive structure. It can be applied to a silicon base having a thickness larger than 300 μm. It can effectively break the limit on thicknesses of silicon bases that can be processed in the related art, and can provide electrical connectivity on both sides of the silicon base. The method is simple and highly reliable, has high processing efficiency and is applicable to mechanized production.

While the embodiments of the present disclosure have been described above, the scope of the present disclosure is not limited thereto. Any equivalent structures or equivalent process alternatives made based on the present disclosure, directly or indirectly applied to any other related technical fields, are to be encompassed by the scope of the present disclosure.

What is claimed is:

1. A method for processing a conductive structure, providing a silicon base, the silicon base comprising a first surface and a second surface opposite to the first surface, the first surface and the second surface having a thickness larger than 300 μm there between, the method including:
   Step S1: forming on the first surface a groove that is concave from the first surface towards the second surface by means of dry etching;
   Step S2: extending the groove from the second surface to form a via through the silicon base; the width of the via along a direction from the first surface towards the second surface is consistent;
   Step S3: processing the via to remove the oxide layer from the via; and
   Step S4: processing a conductive structure within the via; wherein the step S1 comprises:
   Step S11: forming a pattern on the first surface of the silicon base, so as to provide a protection layer on a portion where the via is not provided;
   Step S12: forming the groove that is concave from the first surface towards the second surface on a portion where the protection layer is not provided by means of dry etching; and
   Step S13: forming an oxide layer on the first surface and the second surface by means of oxidation, the oxide layer extending into the groove to form a blocking layer;
   the Step S4 comprises:
   Step S41: depositing doped polysilicon within the via, to form a doped polysilicon layer that only covers an inner wall of the via;
   Step S42: providing a first aluminum conductive layer and a second aluminum conductive layer on the first surface and the second surface, respectively; and
   Step S43: forming a pattern on the first aluminum conductive layer and/or the second aluminum conductive layer to form the conductive structure.

2. The method as described in claim 1, wherein, in the step S3, the oxide layer is removed from the via by means of wet etching.

3. The method as described in claim 1, wherein the step S41 comprises:
   Step S411: depositing doped polysilicon on the silicon base having the via provided therein; and
   Step S412: removing the doped polysilicon deposited on the first surface and the second surface.

4. The method as described in claim 3, wherein, in the Step S412, the doped polysilicon is removed by using a CMP mixed indicator.

5. The method as described in claim 1, wherein the Step S42 further comprises: pre-processing the surfaces of the silicon base.

6. The method as described in claim 1, wherein the Step S43 comprises:
   Step S431: forming a pattern on the first aluminum conductive layer and/or the second aluminum conductive layer so as to provide a protection layer on a portion of the silicon base where the via is not provided; and
   Step S432: forming the conductive structure by wet etching the first aluminum conductive layer and/or the second aluminum conductive layer.

7. The method as described in claim 1, where, in the step 41, a doped polysilicon layer is formed and only covers an inner wall of the via.

* * * * *